United States Patent
Kim et al.

(10) Patent No.: US 10,276,349 B2
(45) Date of Patent: Apr. 30, 2019

(54) PLASMA PROCESSING DEVICE

(71) Applicant: Samsung Electronics Co., Ltd., Suwon-si, Gyeonggi-do (KR)

(72) Inventors: Hak-Young Kim, Bucheon-si (KR); Ji-Myoung Lee, Seoul (KR); Ji-Hee Kim, Goyang-si (KR); Doug-Yong Sung, Seoul (KR); Kyeong-Seok Jeong, Hwaseong-si (KR); Seong-Chul Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 382 days.

(21) Appl. No.: 14/699,443

(22) Filed: Apr. 29, 2015

(65) Prior Publication Data

US 2016/0104604 A1    Apr. 14, 2016

(30) Foreign Application Priority Data

Oct. 13, 2014   (KR) .................. 10-2014-0137711

(51) Int. Cl.
*H01J 37/32* (2006.01)

(52) U.S. Cl.
CPC ....... *H01J 37/32119* (2013.01); *H01J 37/321* (2013.01); *H01J 37/3299* (2013.01); *H01J 37/32522* (2013.01)

(58) Field of Classification Search
CPC ............ H01J 37/32119; H01J 37/3299; H01J 37/32522; H01J 37/321
See application file for complete search history.

(56) References Cited

U.S. PATENT DOCUMENTS

| 5,525,159 A | 6/1996 | Hama et al. |
| 5,863,376 A | 1/1999 | Wicker et al. |
| 6,048,798 A | 4/2000 | Gadgil et al. |
| 6,387,208 B2 | 5/2002 | Satoyoshi et al. |
| 6,822,185 B2 | 11/2004 | Welch et al. |
| 6,916,399 B1 | 7/2005 | Rozenzon et al. |
| 2002/0046807 A1* | 4/2002 | Hongo ............... C23C 16/511 156/345.37 |
| 2005/0183826 A1* | 8/2005 | Choi ................ H01J 37/3244 156/345.34 |
| 2008/0138993 A1* | 6/2008 | Hiroshima ........... H01J 37/321 438/714 |
| 2009/0301656 A1* | 12/2009 | Nishimoto ....... H01J 37/32192 156/345.41 |
| 2011/0168673 A1 | 7/2011 | Nishimoto |

(Continued)

FOREIGN PATENT DOCUMENTS

| JP | 2008-226857 | 9/2008 |
| JP | 2010-073655 | 4/2010 |

(Continued)

*Primary Examiner* — Rakesh K Dhingra
*Assistant Examiner* — Laureen Chan
(74) *Attorney, Agent, or Firm* — Myers Bigel, P.A.

(57) ABSTRACT

A plasma processing device is provided. The plasma processing device includes a plate formed between a window covering a top portion of a chamber where plasma processing is performed and an antenna generating a magnetic field, and a fluid supply unit supplying a fluid for controlling temperatures of the window and the antenna, wherein the plate includes first and second regions supplied with the fluid, and the fluid supply unit independently controls the first and second regions.

12 Claims, 15 Drawing Sheets

(56) References Cited

U.S. PATENT DOCUMENTS

| | | | |
|---|---|---|---|
| 2012/0118505 A1 | 5/2012 | Ishibashi | |
| 2013/0087283 A1* | 4/2013 | McChesney | H01J 37/32119 156/345.26 |
| 2013/0228283 A1* | 9/2013 | McChesney | H01J 37/32119 156/345.27 |
| 2013/0292055 A1* | 11/2013 | Setton | H01J 37/32119 156/345.1 |
| 2014/0130980 A1* | 5/2014 | Lee | H01J 37/32192 156/345.29 |
| 2014/0217895 A1* | 8/2014 | Busche | H01J 37/32522 315/117 |
| 2015/0235808 A1* | 8/2015 | Kamp | H01L 21/3065 438/710 |

FOREIGN PATENT DOCUMENTS

| | | |
|---|---|---|
| JP | 2013-222910 | 10/2013 |
| KR | 10-0666445 B1 | 1/2007 |
| KR | 10-2012-0073884 A | 7/2012 |

* cited by examiner

PLASMA PROCESSING DEVICE

CROSS-REFERENCE TO RELATED APPLICATION

This application claims priority from Korean Patent Application No. 10-2014-0137711 filed on Oct. 13, 2014 in the Korean Intellectual Property Office, and all the benefits accruing therefrom under 35 U.S.C. 119, the contents of which in its entirety are herein incorporated by reference.

FIELD

The present invention relates to a plasma processing device.

BACKGROUND

Controlling a temperature of a window covering an etching chamber where a plasma processing process (e.g., a plasma etching process) is performed is an important issue associated with thermal stress and processing distribution within the window. In addition, the thermal stress and the processing distribution are issues affecting the yield.

In general, in the window of the etching chamber where a plasma processing process is performed, a higher temperature may be sensed at its center, compared to its edge. In order to appropriately control the thermal stress and the processing distribution within the window of the etching chamber, it may be important to reduce a temperature difference between the center and the edge of the window. Accordingly, there are increasing demands for research into methods for reducing the temperature difference.

SUMMARY

The present invention also relates to a plasma processing device, which can reduce a temperature difference between a center and an edge of a window by selectively controlling a temperature of a plate of a plasma etching chamber.

The present invention also relates to a plasma processing device, which allows a magnetic field generated by an antenna to be incident into the entire area of a window with the same intensity through a coupling structure of a plate and a gas feed.

Further, the present invention relates to a plasma processing device, which can efficiently control a temperature of a window by incorporating a fluid supply unit selectively supplying hot air or cool air.

These and other objects of the present invention will be described in or be apparent from the following description.

According to an aspect of the present invention, there is provided a plasma processing device that includes a plate formed between a window covering a top portion of a chamber where plasma processing is performed and an antenna generating a magnetic field, and a fluid supply unit supplying a fluid for controlling temperatures of the window and the antenna, wherein the plate includes first and second regions supplied with the fluid, and the fluid supply unit independently controls the first and second regions.

The window includes a dielectric material.

The antenna includes an inductively coupled plasma (ICP) antenna.

The first region includes an inlet port through which the fluid flows in and an outlet port through which the fluid flows out.

The first region further includes a fluid conduit in which the incoming fluid flows, and the fluid conduit has one end connected to the inlet port and the other end connected to the outlet port of the fluid conduit.

The plasma processing device further comprises an inlet pipe connecting the inlet port and the fluid supply unit; and an outlet pipe connecting the outlet port and the fluid supply unit.

The plate and the window having the same dielectric constant and the same magnetic field permeability.

The plasma processing device further comprises a clamp connecting the plate and the window.

The first and second regions are positioned at the center of the plate.

The fluid includes a first fluid for lowering temperatures of the window and the antenna and a second fluid for raising the temperature of the window.

The plasma processing device further comprises a temperature sensor unit sensing the temperature of the window, wherein the fluid supply unit receives the temperature of the window from the temperature sensor unit.

The fluid supply unit supplies one of the first and second fluids to the plate according to the temperature of the window.

The plasma processing device further comprises a gas feed supplying a processing gas to the inside of the chamber.

The gas feed and the plate include the same material.

The plate includes a coupling groove exposing a portion of a top portion of the window and the gas feed is engaged with the coupling groove.

According to another aspect of the present invention, there is provided a plasma processing device including a plate formed between a window covering a top portion of a chamber where plasma processing is performed and an antenna generating a magnetic field; a temperature sensor unit sensing a temperature of the window; and a fluid supply unit supplying a first fluid for lowering temperatures of the window and the antenna and a second fluid for raising the temperature of the window and receiving the temperature of the window from the temperature sensor unit, wherein the fluid supply unit supplies one of the first and second fluids to the plate according to the temperature of the window.

The plasma processing device further comprises a clamp connecting the plate and the window and mounted at a lower portion of an edge of the plate; and inlet and outlet pipes connecting the plate and the fluid supply unit.

The window includes a slide groove, the clamp includes a slide protrusion engaged with the slide groove, and one end of each of the inlet and outlet pipes is fixed to a top surface of the plate.

Clamp and the inlet and outlet pipes fix the plate on the window.

According to still another aspect of the present invention, there is provided a plasma processing device including a plate formed between a window covering a top portion of a chamber where plasma processing is performed and an antenna generating a magnetic field; and a gas feed supplying a processing gas to the inside of the chamber and including the same material with the plate, wherein the plate includes a coupling groove exposing a portion of a top portion of the window and the gas feed is engaged with the coupling groove.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
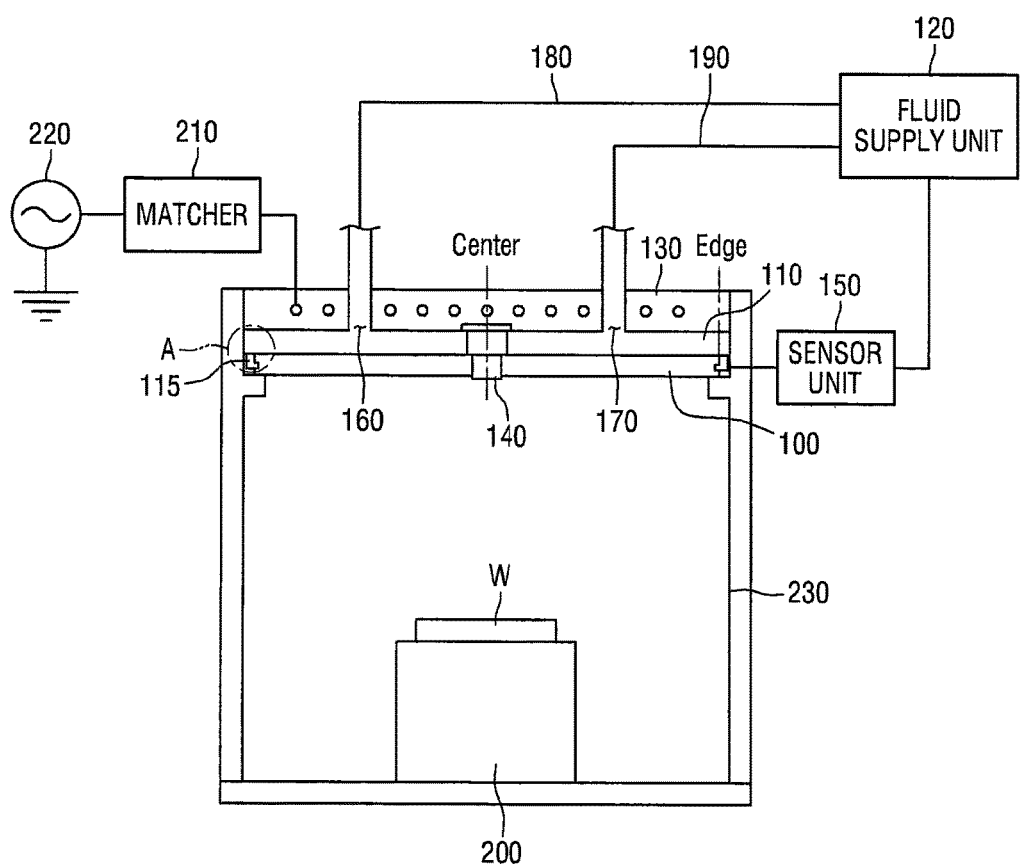
FIG. 1 is a schematic view illustrating a plasma processing device according to an embodiment of the present invention.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a plasma processing device according to an embodiment of the present invention will be described with reference to FIGS. 1 to 12.

Figure 2:
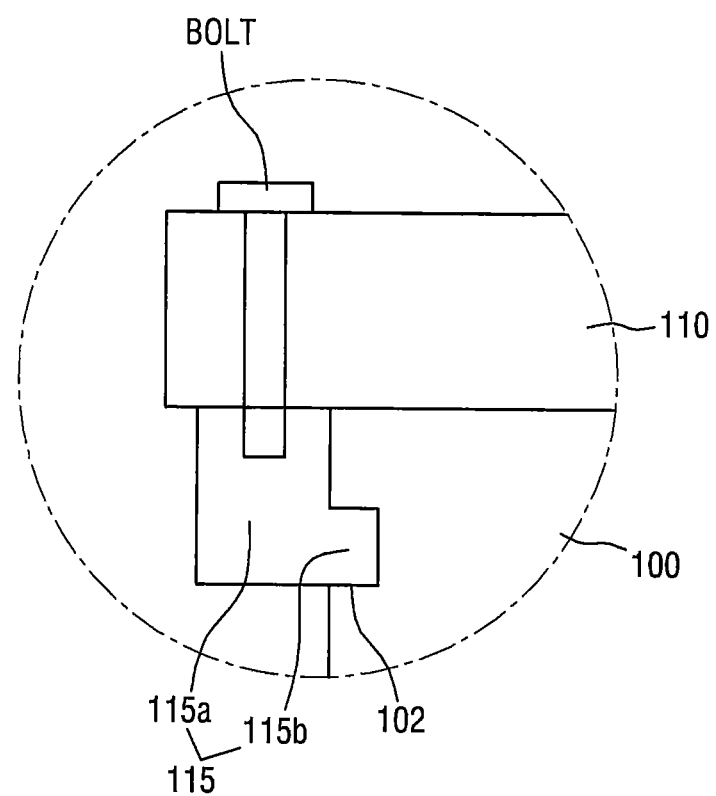
FIG. 2 is an enlarged view of FIG. 1.
Figure 3:
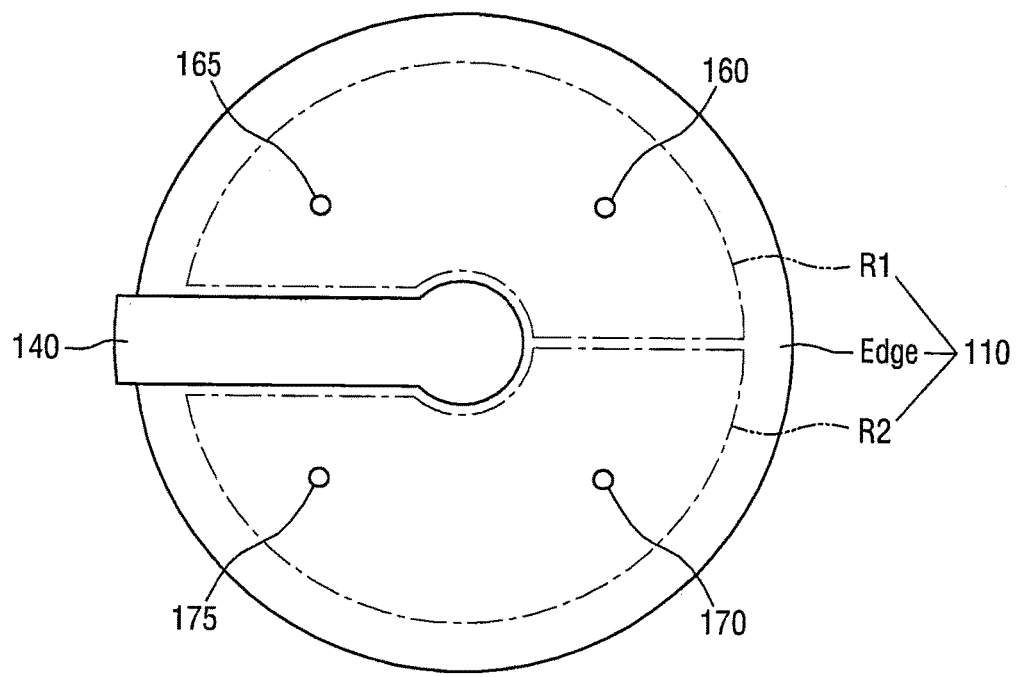
FIG. 3 is a plan view for explaining a plate and a gas feed shown in FIG. 1.
Figure 4:
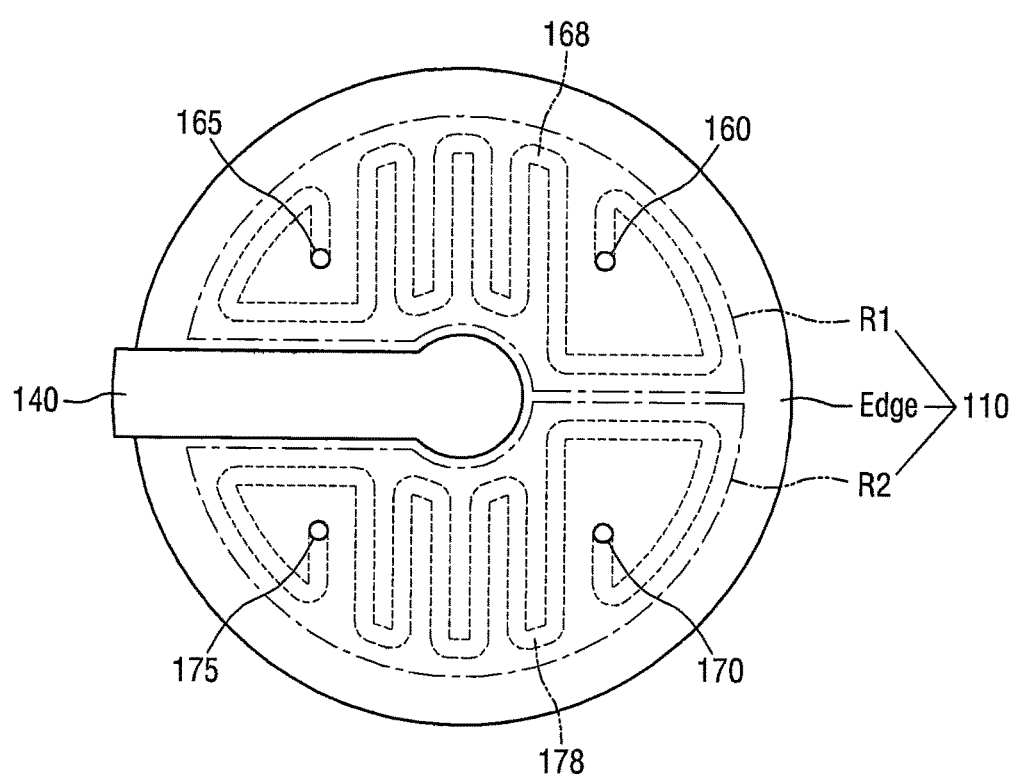
FIG. 4 is a schematic view for explaining a first region and a second region of a plate shown in FIG. 3.
Figure 5:
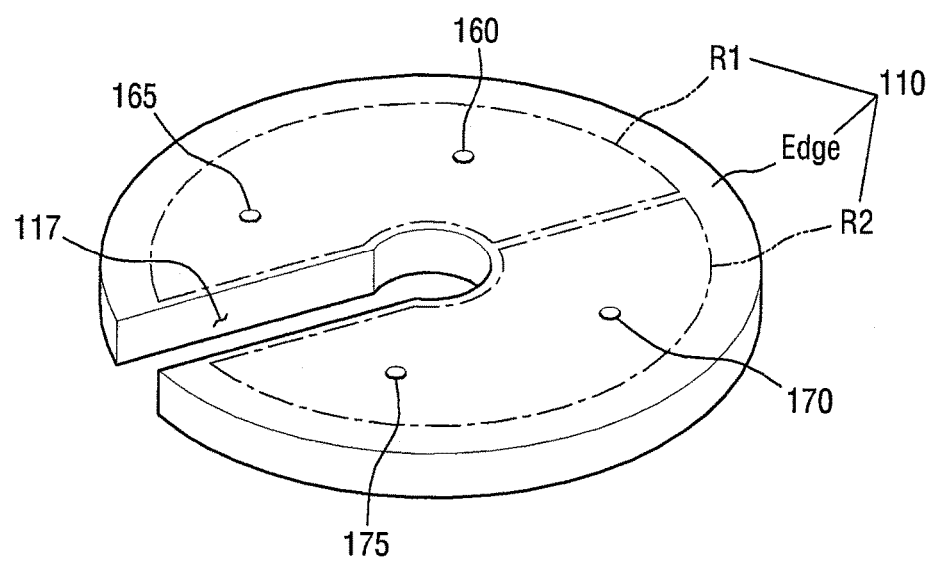
FIGS. 5 and 6 are perspective views for explaining a connection relationship between a plate and a gas feed shown in FIG. 3.
Figure 6:
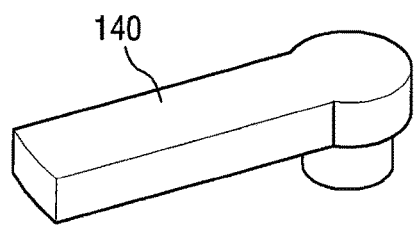
Figure 7:
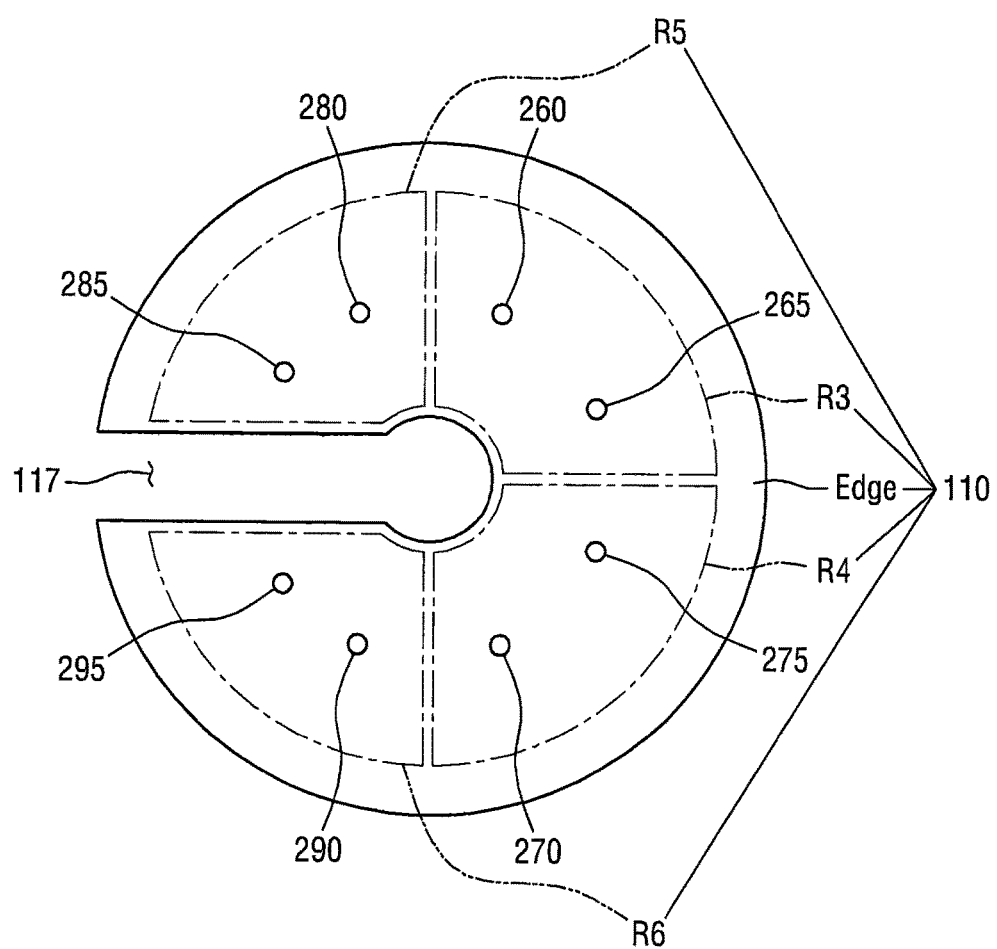
FIGS. 7 and 8 are views for explaining other embodiments of a plate shown in FIG. 4.
Figure 8:
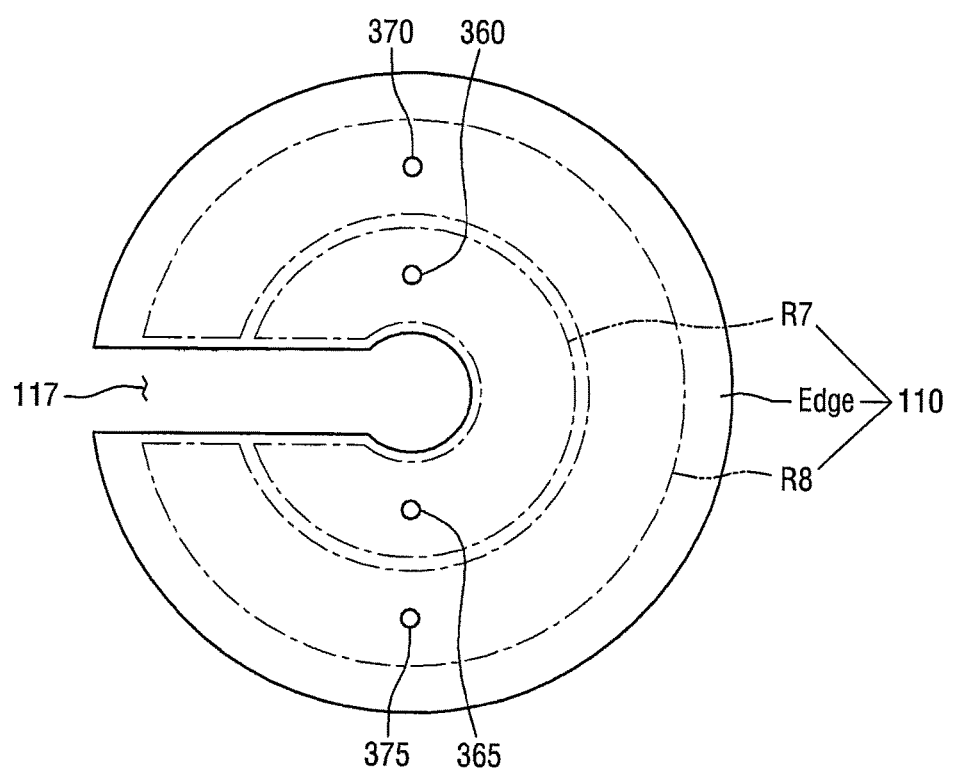
Figure 9:
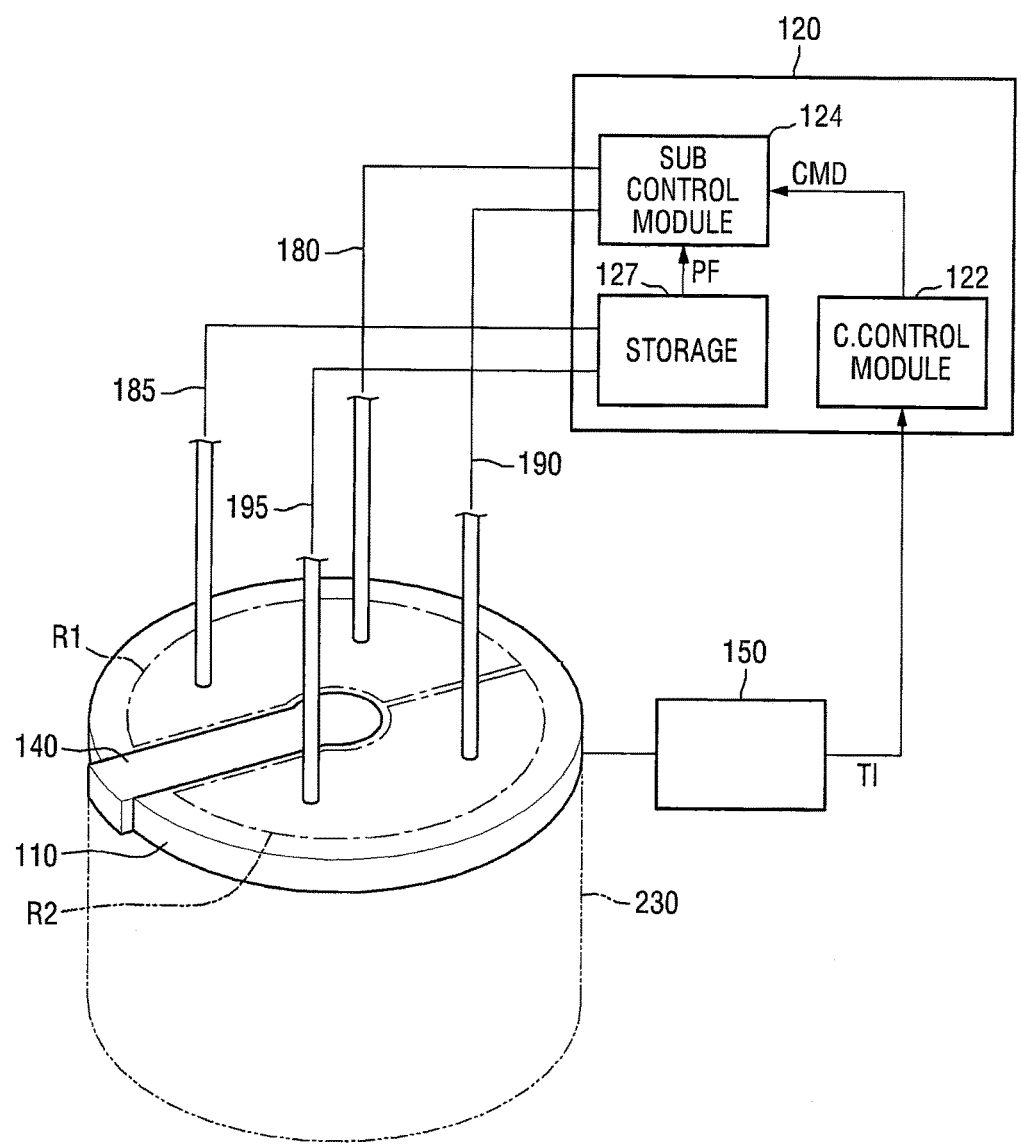
FIGS. 9 and 10 are schematic views for explaining a fluid supply unit and inlet and outlet pipes shown in FIG. 1.
Figure 10:
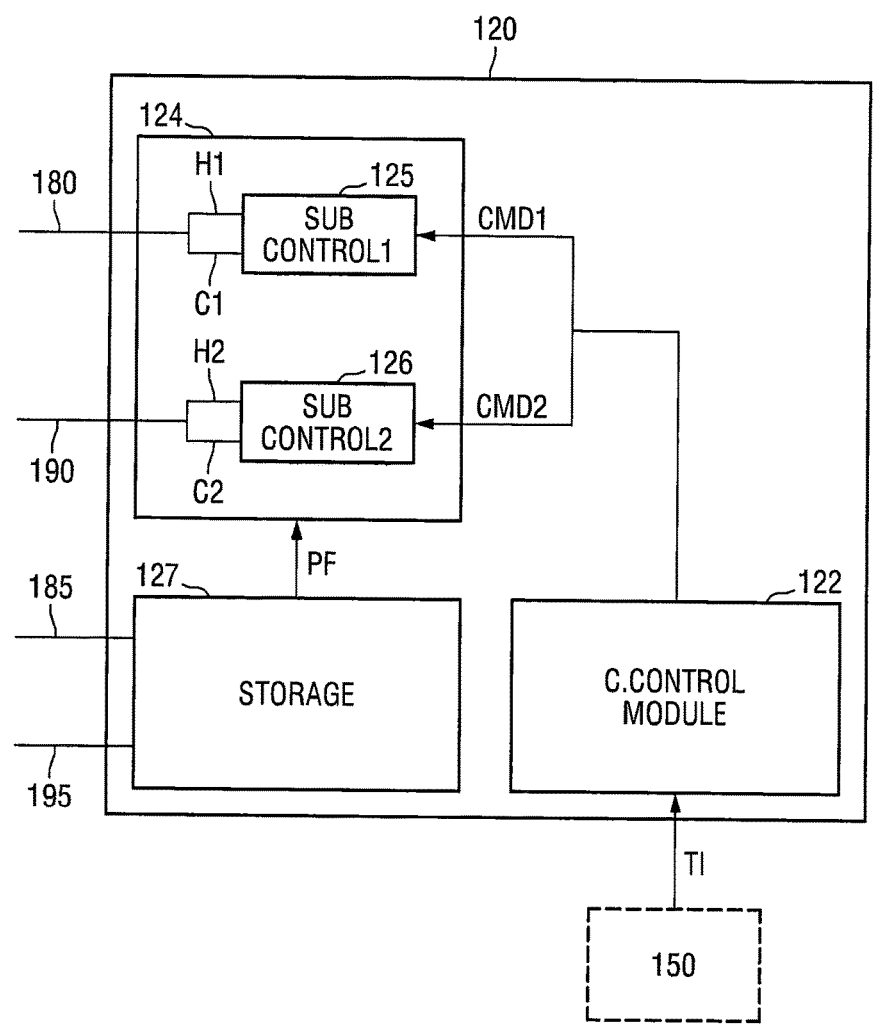
Figure 11:
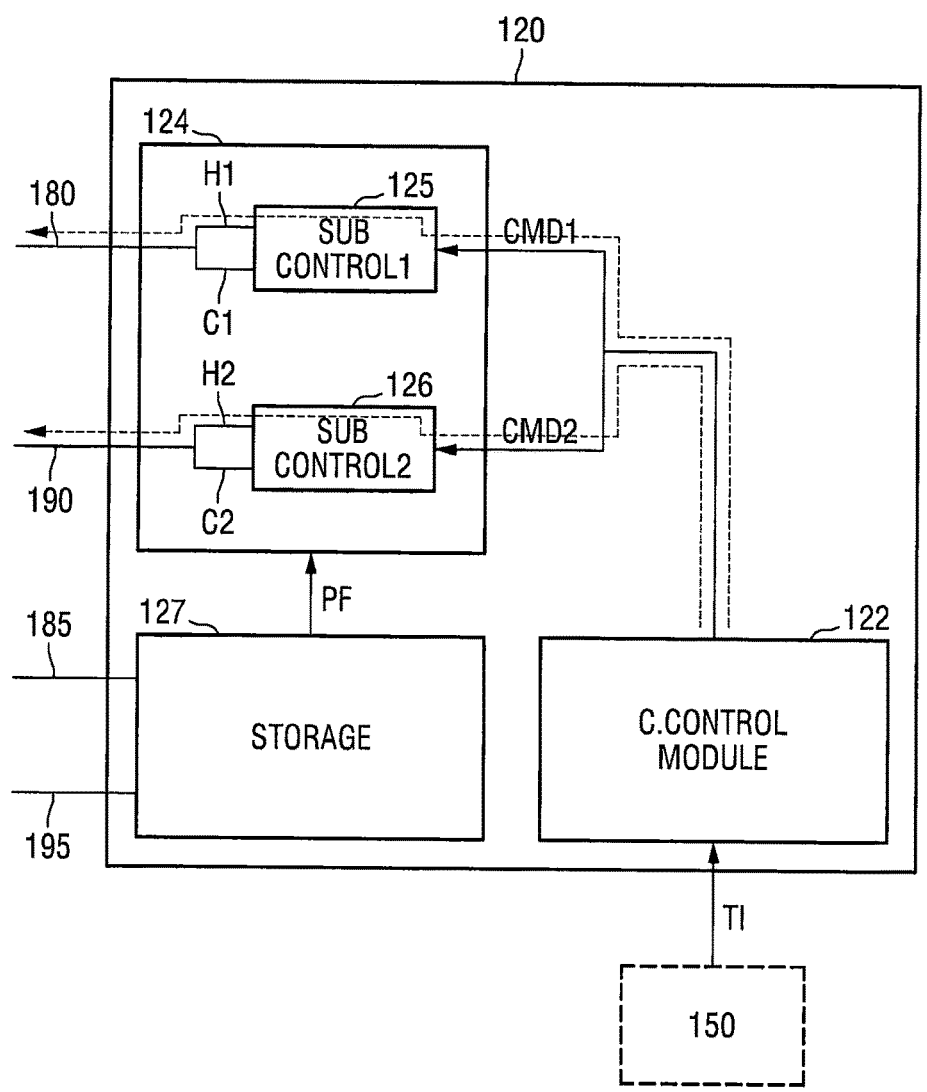
FIGS. 11 and 12 are views for explaining a fluid supply process of a fluid supply unit.
Figure 12:
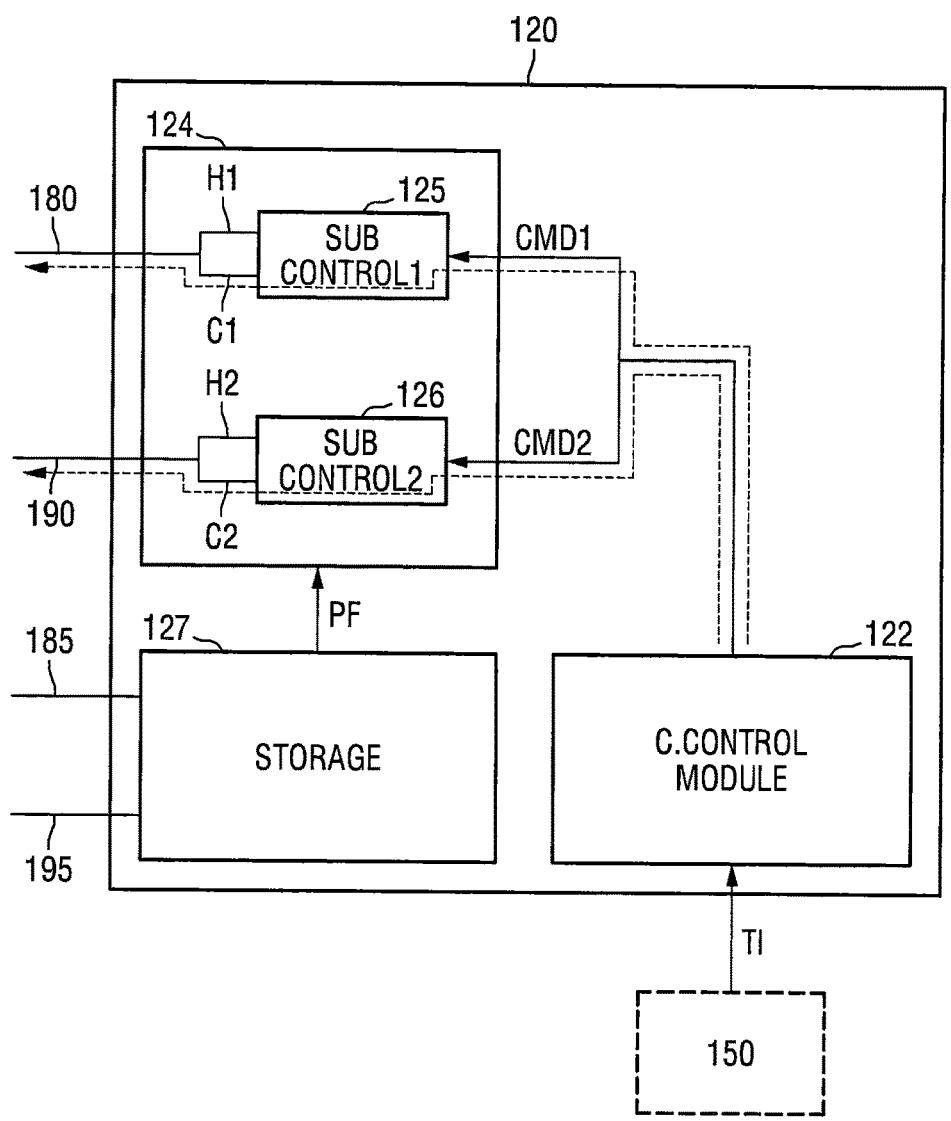

FIG. 1 is a schematic view illustrating a plasma processing device according to an embodiment of the present invention, FIG. 2 is an enlarged view of FIG. 1, FIG. 3 is a plan view for explaining a plate and a gas feed shown in FIG. 1, FIG. 4 is a schematic view for explaining a first region and a second region of a plate shown in FIG. 3, FIGS. 5 and 6 are perspective views for explaining a connection relationship between a plate and a gas feed shown in FIG. 3, FIGS. 7 and 8 are views for explaining other embodiments of a plate shown in FIG. 4, FIGS. 9 and 10 are schematic views for explaining a fluid supply unit and inlet and outlet pipes shown in FIG. 1, and FIGS. 11 and 12 are views for explaining a fluid supply process of a fluid supply unit.

Referring first to FIG. 1, the plasma processing device 1 according to an embodiment of the present invention may include a window 100, a plate 110, a fluid supply unit 120, an antenna 130, a gas feed 140, a temperature sensor unit 150, inlet pipes 180 and 190, an electrostatic chuck (ESC) 200, and a chamber 230.

The window 100 may be formed on a top portion of the chamber 230.

In detail, the window 100 may form an outer wall of the top portion of the chamber 230. In addition, the window 100 may allow the chamber 230 to be maintained at a vacuum state and may allow an inductive electromagnetic field generated from the antenna 130 to pass through the inside of the chamber 230.

When the outer wall of the chamber 230 is entirely metallic, the inductive electromagnetic field generated from the antenna 130 may not pass through the inside of the chamber 230. Therefore, one plane of the chamber 230 is formed by the window 100, thereby allowing the inductive electromagnetic field generated from the antenna 130 to pass through the inside of the chamber 230 through the window 100 while reacting with the gas contained in the chamber 230 to form a plasma.

While a plasma processing process is performed, the temperature of the window 100 is slowly raised by the plasma generated inside the chamber 230, and then saturated at a constant temperature. The result of the process performed while the temperature varies may not be constant.

Therefore, a heater (not shown) is provided between the antenna 130 and the window 100 to maintain the temperature of the window 100 by the heat generated from the heater.

The window 100 may include a dielectric material. The dielectric material may include, for example, $Al_2O_3$, but not limited thereto. In addition, the window 100 and the plate 110 may have the same dielectric constant and the same magnetic field permeability.

The window 100 may be connected and fixed to the plate 110 using a clamp 115.

In detail, referring to FIG. 2, the clamp 115 may be coupled to a lower portion of an edge of the plate 110 using a bolt. That is to say, the clamp 115 may include a body part 115a and a slide protrusion 115b. The body part 115a may be coupled to a lower portion of an edge of the plate 110 using a bolt.

In addition, the window 100 may include a slide groove 102. The slide protrusion 115b of the clamp 115 may be engaged with the slide groove 102. Here, the slide groove 102 may be formed on a lateral surface of the window 100, but aspects of the present invention are not limited thereto.

Referring again to FIG. 1, the temperature of the window 100 may be controlled by the plate 110 formed on the window 100. That is to say, the temperature of the center of the window 100 is controlled by the fluid flowing through the plate 110 and the temperature of the edge of the window 100 is controlled by a material contained in the plate 110, the material having low thermal conductivity (K) (e.g., less than 20 [W/m–k]), which will later be described in detail.

The plate 110 may be positioned between the window 100 covering a top portion of the chamber 230 where plasma processing is performed and the antenna 130 generating a magnetic field (e.g., an inductive electromagnetic field).

Referring to FIGS. 3 and 4, the plate 110 may include first and second regions R1 and R2 supplied with fluids, and the first and second regions R1 and R2 may be independently controlled by the fluid supply unit (120 of FIG. 1).

The plate 110 divided into two regions is illustrated in FIGS. 3 and 4, but aspects of the present invention are not limited thereto. That is to say, the plate 110 may be divided into two or more regions and the respective regions may be independently and selectively controlled by the fluid supply unit (120 of FIG. 1).

The first region R1 may include a first inlet port 160 through which a fluid flows in and a first outlet port 165 through which a fluid flows out.

The fluid flowing in through the first inlet port 160 may be used in controlling a temperature of a window and the fluid flowing out through the first outlet port 165 may be used in controlling a temperature of the antenna 130. Here, the fluid may be supplied from the fluid supply unit 120.

In addition, the first region R1 may further include a first fluid conduit 168 in which the flow flowing in through the first inlet port 160 flows and the first fluid conduit 168 may have one end connected to the first inlet port 160 and the other end connected to the first outlet port 165. That is to say, the fluid flowing in through the first inlet port 160 may flow out through the first outlet port 165 after passing through the first fluid conduit 168.

In more detail, the first inlet port 160 and the fluid supply unit 120 may be connected to each other through the first inlet pipe (180 of FIG. 9) and the first outlet port 165 and the fluid supply unit 120 may be connected to each other through the first outlet pipe (185 of FIG. 9).

The second region R2 may include a second inlet port 170 through which a fluid flows in and a second outlet port 175 through which a fluid flows out.

The flowing in through the second inlet port 170 may be used in controlling the temperature of the window and the fluid flowing out through the second outlet port 175 may be used in controlling the temperature of the antenna 130. Here, the fluid may be supplied from the fluid supply unit 120.

In addition, the second region R2 may further include a second fluid conduit 178 in which the flow flowing in through the second inlet port 170 and the second fluid conduit 178 may have one end connected to the second inlet port 170 and the other end connected to the second outlet port 175. That is to say, the fluid flowing in through the second inlet port 170 may flow out through the second outlet port 175 after passing through the second fluid conduit 178.

In more detail, the second inlet port 170 and the fluid supply unit 120 may be connected to each other through the second inlet pipe (190 of FIG. 9) and the second outlet port 175 and the fluid supply unit 120 may be connected to each other through the second outlet pipe (195 of FIG. 9).

The first and second regions R1 and R2 may be positioned at the center of the plate 110. Therefore, the temperature of the center of the window (100 of FIG. 1) may be controlled by the fluid flowing through the first and second regions R1 and R2 and the temperature of the edge of the window 100 may be controlled by a material contained in the plate 110, the material having low thermal conductivity. In addition, a gas feed 140 may be formed to cross a region between the first and second regions R1 and R2, but aspects of the present invention are not limited thereto.

Here, the gas feed 140 and the plate 110 may include the same material, e.g., polyether ether ketone (PEEK), but aspects of the present invention are not limited thereto.

Additionally, the window 100 and the plate (110 of FIG. 1) may have the same dielectric constant and the same magnetic field permeability. In addition, the plate 110 may include a material having low thermal conductivity and a low thermal expansion coefficient, e.g., polyether ether ketone (PEEK), but aspects of the present invention are not limited thereto.

In addition, as described above, the plate 110 may be connected and fixed to the window (100 of FIG. 1) using the clamp (115 of FIG. 2).

Next, referring to FIGS. 5 and 6, a connection relationship between the plate 110 and the gas feed 140 is illustrated.

FIG. 5 illustrates the plate 110 from which the gas feed (140 of FIG. 6) is separated and removed. In detail, the plate 110 may include a coupling groove 117 exposing a portion of a top portion of the window 100. Here, the coupling groove 117 may be formed to cross a portion between the first and second regions R1 and R2, but aspects of the present invention are not limited thereto.

FIG. 6 illustrates the gas feed 140 from which the plate (110 of FIG. 5) is separated and removed. In detail, the gas feed 140 may supply a processing gas to the inside of a chamber (230 of FIG. 1). In addition, the gas feed 140 may be engaged with the coupling groove (117 of FIG. 5) of the plate (110 of FIG. 5).

As described above, since the gas feed 140 including the same material with the plate 110 is engaged with the coupling groove 117 of the plate 110, the plate 110 and the gas feed 140 may have the same UV permeability with respect to a magnetic field generated by the antenna (130 of FIG. 1) when viewed from the antenna (130 of FIG. 1). Accordingly, UV radiation having uniform intensity may be incident into the window 100.

FIGS. 7 and 8 illustrate alternative embodiments of the plate shown in FIG. 4.

First, the plate 110 shown in FIG. 7 includes four regions, that is, third to sixth regions R3 to R6, unlike the plate 110 shown in FIG. 4. The third to sixth regions R3 to R6 may be independently controlled by the fluid supply unit (120 of FIG. 1) and may be used in controlling the temperature of the center of the window (100 of FIG. 1). In addition, the third to sixth regions R3 to R6 may have inlet ports 260, 270, 280 and 290, outlet ports 265, 275, 285 and 295, and fluid conduits (not shown), respectively.

Referring to FIG. 8, seventh and eighth regions R7 and R8 of the plate 110 may be shaped of rings, unlike in FIGS. 4 and 7. The seventh and eighth regions R7 and R8 may be independently controlled by the fluid supply unit (120 of FIG. 1) and may be used in controlling the temperature of the center of the window (100 of FIG. 1). In addition, the seventh and eighth regions R7 and R8 may have inlet ports 360 and 370, outlet ports 365 and 375, fluid conduits (not shown), respectively.

As described above, the plate 110 may include regions having various shapes and numbers, and the respective regions may be independently and selectively controlled by the fluid supply unit (120 of FIG. 1), thereby efficiently controlling the temperature of the window 100.

Referring again to FIG. 1, the fluid supply unit 120 may supply a fluid for controlling temperatures of the window 100 and the antenna 130. In addition, the fluid supply unit 120 may be connected to the first inlet port 160 of the plate 110 through the first inlet pipe 180 and may be connected to the second inlet port 170 of the plate 110 through the second inlet pipe 190.

In detail, referring to FIG. 9, the fluid supply unit 120 may include a central control module 122, a sub control module 124, and a storage 127.

Here, the central control module 122 may receive information T1 concerning the temperature of the window 100 from the temperature sensor unit 150 sensing the temperature of the window 100 and may supply a control command CMD to the sub control module 124.

The control command CMD may include information concerning the fluid supplied to the plate 110, for example, information on the pressure, flow rate and temperature of the fluid, but aspects of the present invention are not limited thereto.

The sub control module 124 may receive the control command CMD from the central control module 122 and may supply the fluid to the first and second regions R1 and R2 of the plate 110 through the first and second inlet pipes 180 and 190. In addition, the sub control module 124 may receive the fluid PF from the storage 127.

The storage 127 may receive the fluids flowing out from the first and second regions R1 and R2 of the plate 110 through the first and second outlet pipes 185 and 195 and may store the received fluids. In addition, the storage 127 may supply the fluid PF stored therein to the sub control module 124. Here, the stored fluid may be cleansed in the storage 127, and the storage 127 may supply the cleansed fluid (CF) to the sub control module 124.

Referring to FIG. 10, the fluid supply unit 120 is illustrated in more detail.

First, the sub control module 124 may include a first sub controller 125 and a second sub controller 126. In the present invention, two sub controllers included in the sub control module 124 are illustrated, but aspects of the present invention are not limited thereto. The number of sub controllers may increase or decrease according to the number of regions of the plate (110 of FIG. 9).

The first sub controller 125 may supply the fluid to the first region (R1 of FIG. 9) of the plate (110 of FIG. 9). In addition, the first sub controller 125 may control the pressure, flow rate and temperature of the fluid based on the first control command CMD1 received from the central control module 122 and may supply the fluid to the first region (R1 of FIG. 9) through the first inlet pipe 180.

Here, the fluid may include a first fluid for lowering temperatures of the window (100 of FIG. 1) and the antenna (130 of FIG. 1) and a second fluid for raising the temperature of the window (100 of FIG. 1).

In addition, the first sub controller 125 may supply the first fluid to first inlet pipe 180 through the first cooling pipe C1 and the second fluid to the first inlet pipe 180 through the first heating pipe H1, based on the first control command CMD1. That is to say, when it is necessary to lower the temperatures of the window (100 of FIG. 1) and the antenna (130 of FIG. 1), the first sub controller 125 may supply the first fluid based on the first control command CMD1, and when it is necessary to raise the temperature of the window (100 of FIG. 1), the first sub controller 125 may supply the second fluid based on the first control command CMD1.

To sum up, the first sub controller 125 may supply one of the first fluid and the second fluid based on the first control command CMD1.

Here, when it is necessary to raise the temperature of the window (100 of FIG. 1), for example, a polymer may be generated due to a chemical reaction taking place at an internal corner of the chamber (230 of FIG. 1). In this case, the temperature of the window (100 of FIG. 1) may be raised, thereby removing the polymer.

The second sub controller 126 may supply the fluid to the second region (R2 of FIG. 9) of the plate (110 of FIG. 9). In addition, the second sub controller 126 may control the pressure, flow rate and temperature of the fluid based on the second control command CMD2 received from the central control module 122 and may supply the fluid to the second region (R2 of FIG. 9) through the second inlet pipe 190.

Here, the fluid may include a first fluid for lowering temperatures of the window (100 of FIG. 1) and the antenna (130 of FIG. 1) and a second fluid for raising the temperature of the window (100 of FIG. 1).

In addition, the second sub controller 126 may supply the first fluid to second inlet pipe 190 through the second cooling pipe C2 and the second fluid to the second inlet pipe 190 through the second heating pipe H2, based on the second control command CMD2. That is to say, when it is necessary to lower the temperatures of the window (100 of FIG. 1) and the antenna (130 of FIG. 1), the second sub controller 126 may supply the first fluid based on the second control command CMD2, and when it is necessary to raise the temperature of the window (100 of FIG. 1), the second sub controller 126 may supply the second fluid based on the second control command CMD2.

To sum up, the second sub controller 126 may supply one of the first fluid and the second fluid based on the second control command CMD2.

Referring to FIG. 11, a process of the fluid supply unit 120 in a case where it is necessary to raise the temperature of the window (100 of FIG. 1) is illustrated.

In detail, the central control module 122 may receive information T1 concerning the temperature of the window 100 from the temperature sensor unit 150 sensing the temperature of the window 100 to determine whether it is necessary to raise the temperature of the window (100 of FIG. 1).

If it is necessary to raise the temperature of the window (100 of FIG. 1), the central control module 122 may generate the first and second control commands CMD1 and CMD2 and may supply the same to the first and second controllers 125 and 126, respectively. The first and second controllers 125 and 126 may supply the second fluid to the first and second induction pipes 180 and 190 through the first and second heating pipes H1 and H2 based on the first and second control commands CMD1 and CMD2, respectively.

Here, the first sub controller 125 and the second sub controller 126 may receive the control commands CMD1 and CMD2 different from each other from the central control module 122 and the first and second regions R1 and R2 may be independently controlled based on the different control commands CMD1 and CMD2. That is to say, a first control command flow CMD1-F controlling the first region R1 and a second control command flow CMD2-F controlling the second region R2 are independent of each other.

Referring to FIG. 12, a process of the fluid supply unit 120 in a case where it is necessary to lower the temperatures of the window (100 of FIG. 1) and the antenna (130 of FIG. 1) is illustrated.

In detail, the central control module 122 may receive information T1 concerning the temperature of the window 100 from the temperature sensor unit 150 to determine whether it is necessary to lower the temperatures of the window (100 of FIG. 1) and the antenna (130 of FIG. 1).

If it is necessary to lower the temperatures of the window (100 of FIG. 1) and the antenna (130 of FIG. 1), the central control module 122 may generate the first and second control commands CMD1 and CMD2 and may supply the same to the first and second controllers 125 and 126, respectively. The first and second controllers 125 and 126 may supply the first fluid to the first and second induction pipes 180 and 190 through the first and second cooling pipes C1 and C2 based on the first and second control commands CMD1 and CMD2, respectively.

Here, the first sub controller 125 and the second sub controller 126 may receive the control commands CMD1 and CMD2 different from each other from the central control module 122 and the first and second regions R1 and R may be independently controlled based on the different control commands CMD1 and CMD2. That is to say, the first control command flow CMD1-F controlling the first region R1 and the second control command flow CMD2-F controlling the second region R2 are independent of each other.

Additionally, the first control command CMD1 and the second control command CMD2 may be different from each other. That is to say, the pressure, flow rate and temperature of the fluid, indicated by the first control command CMD1, and the pressure, flow rate and temperature of the fluid, indicated by the second control command CMD2, may be different from each other.

In addition, not shown, the first sub controller 125 may supply the first fluid through the first cooling pipe C1 while the second sub controller 126 may supply the second fluid through the second heating pipe H2. Here, the first sub controller 125 may supply the second fluid through the first heating pipe H1 while the second sub controller 126 may supply the first fluid through the second cooling pipe C2.

In addition, only one of the first sub controller 125 and the second sub controller 126 may supply the fluid to the plate (110 of FIG. 9).

Referring again to FIG. 1, the antenna 130 may be positioned on the plate 110 and may generate a magnetic field (e.g., an inductive electromagnetic field).

In detail, the processing gas sprayed into the chamber 230 under a vacuum state by the gas feed 140 may react with the magnetic field generated from the antenna 130, thereby forming plasma within the chamber 230. In addition, if radio frequency (RF) power 220 is applied to the antenna 130 through a matcher 210, the antenna 130 may generate the magnetic field.

Additionally, the antenna 130 may include, for example, an inductively coupled plasma (ICP) antenna, but aspects of the present invention are not limited thereto.

The temperature sensor unit 150 may sense the temperature of the window 100.

In detail, the temperature sensor unit 150 may sense the temperature of the window 100 and may supply information concerning temperatures to the fluid supply unit 120.

The electrostatic chuck 200 may be mounted within the chamber 230 to fix a position of a wafer W to be subjected to a plasma processing process.

In detail, the electrostatic chuck 200 may include an electrode (not shown) positioned at its lower portion and may maintain the position of the wafer W positioned on the electrostatic chuck 200 using static electricity generated from the electrode (not shown) or may fix the wafer W in a horizontal state.

The plasma processing process may be performed in the chamber 230. In more detail, a dry etching process using plasma may be performed in the chamber 230.

In detail, the chamber 230 where the dry etching process using plasma is performed may be classified into a reactive ion etching (RIE) type, a magnetically enhanced reactive ion etching (MERIE) type, a chemical downstream etching (CDE) type, an electron cyclotron resonance (ECR) type, a transformer coupled plasma (TCP) type, etc., according to the plasma forming method. Alternatively, the chamber 230 may be largely classified into a capacitive coupled plasma (CCP) type and an inductive coupled plasma (ICP) type.

Here, in the CCP type, RF power is selectively applied to a plurality of electrodes installed within a chamber and a reactant gas is transformed into a plasma state by an electric field formed. In addition, in the ICP type, RF power is selectively applied to a coil wound around an exterior side of a chamber and a plurality of electrodes installed within the chamber and a reactant gas is transformed into a plasma state by a magnetic field and an electric field formed.

In the present invention, the chamber 230 of ICP type is illustrated, but aspects of the present invention are not limited thereto.

Hereinafter, effects of the plasma processing device shown in FIG. 1 will be described with reference to FIGS. 13 and 14.

Figure 13:
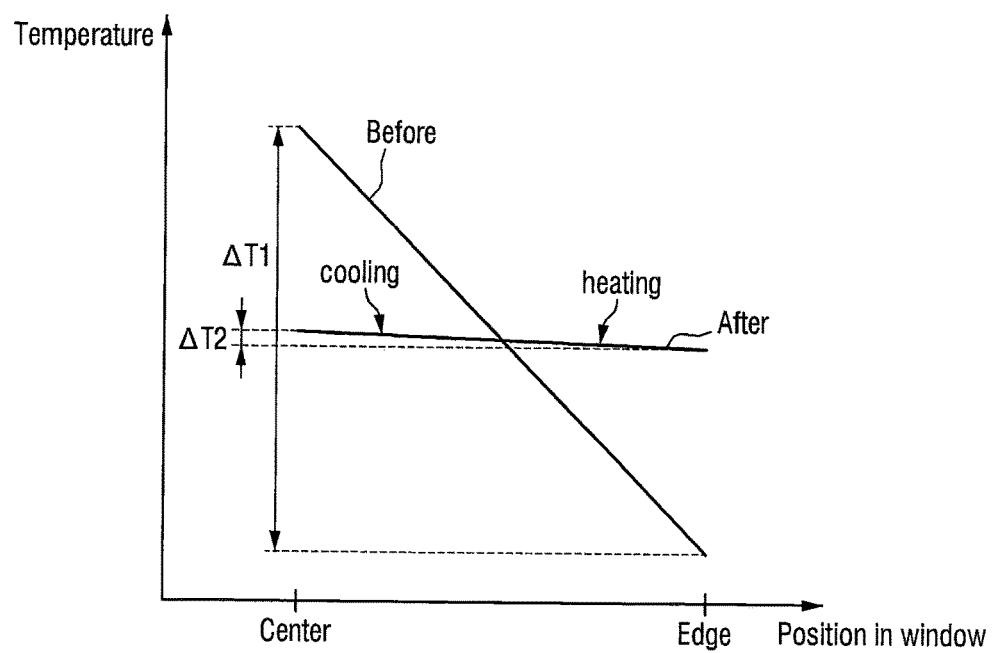
FIGS. 13 and 14 are views for explaining effects of the plasma processing device shown in FIG. 1.
Figure 14:
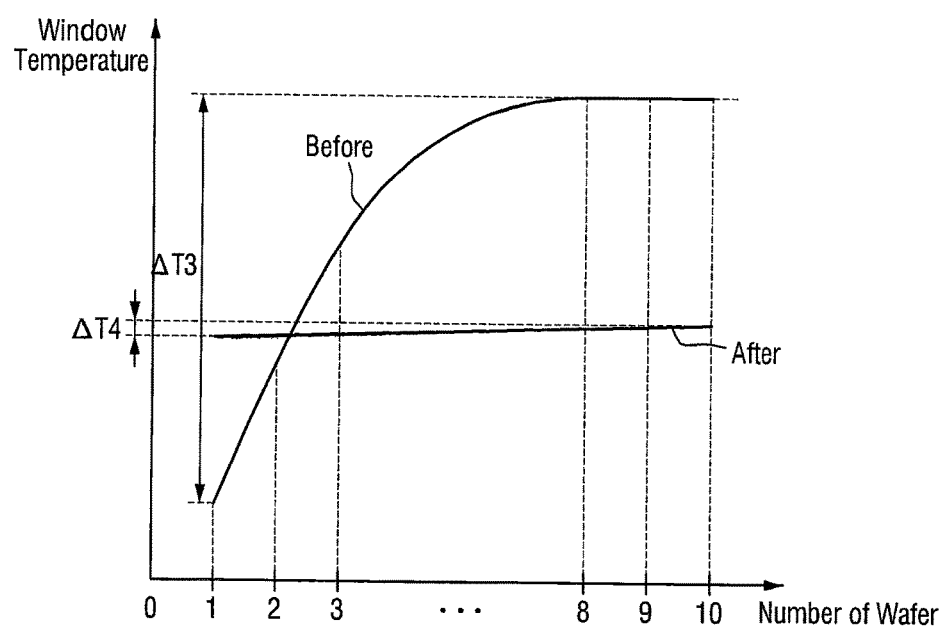

FIGS. 13 and 14 are views for explaining effects of the plasma processing device shown in FIG. 1.

Referring to FIGS. 1 and 13, before using the plasma processing device 1 shown in FIG. 1, there is a considerably large temperature difference between the center and edge of the window (that is, a first temperature difference (ΔT1)) in performing a plasma processing process.

However, after using the plasma processing device 1 shown in FIG. 1, when performing a plasma processing process, there may be a temperature difference between the center and edge of the window (that is, a second temperature difference (ΔT2)), which is smaller than the first temperature difference (ΔT1).

As described above, the temperature of the center of the window 100 is lowered by the fluid flowing through the plate 110 (e.g., cool air) and the edge of the window 100 is warmed by a material contained in the plate 110, the material having low thermal conductivity (K) (e.g., less than 20 [W/m–k]).

Consequently, during the plasma processing process, the temperature of the center of the window 100 being at a high temperature is lowered and the temperature of the edge of the window 100 being at a low temperature is raised.

Referring to FIGS. 1 and 14, before using the plasma processing device 1 according to an embodiment of the present invention, as a plasma processing process is progressed (that is, as the number of wafers subjected to the plasma processing process increases), the temperature of the window 100 is slowly raised by the plasma generated from the chamber 230 to be eventually saturated at a constant temperature. That is to say, there is a considerably large temperature difference between the window for plasma-processing a first wafer and the window for plasma-processing a last wafer (that is, a third temperature difference (ΔT3)).

However, after using the plasma processing device 1 according to an embodiment of the present invention, there may be a temperature difference between the window for plasma-processing a front wafer and the window for plasma-processing a rear wafer. That is to say, a temperature difference (that is, a fourth temperature difference (ΔT4)) between the window for plasma-processing a first wafer and the window for plasma-processing the last wafer (e.g., a tenth wafer) is smaller than the third temperature difference (ΔT3).

As described above, the temperature of the center of the window 100 is lowered by the fluid flowing through the plate 110 (e.g., cool air) and the edge of the window 100 is warmed by a material contained in the plate 110, the material having low thermal conductivity (K) (e.g., less than 20 [W/m–k]), thereby uniformly maintaining the overall temperature of the window 100.

That is to say, since the overall temperature of the window 100 is uniformly maintained, even if the plasma processing process is progressed, the temperature difference between the window for plasma-processing the first wafer and the window for plasma-processing the last wafer is not so large.

Additionally, the plasma processing device 1 may reduce a difference in the etching interval (that is, a trench interval produced by plasma etching) between a wafer plasma-processed for the first time and a wafer plasma-processed for the last time to be within a tolerance range by preventing the temperature difference between the window for plasma-processing the first wafer and the window for plasma-processing the last wafer from being increased.

That is to say, before using the plasma processing device 1 according to an embodiment of the present invention, the difference in the etching interval between the wafer plasma-processed for the first time and the wafer plasma-processed for the last time may be a first difference interval, and after using the plasma processing device 1 according to an embodiment of the present invention, the difference between the etching interval of the wafer plasma-processed for the first time and the etching interval of the wafer plasma-processed for the last time may be a second difference interval, which is smaller than the first difference interval.

In the plasma processing device 1 according to an embodiment of the present invention, the plate 110 is divided into a plurality of regions (e.g., first and second regions R1 and R2) and temperatures of the respective regions are independently and selectively controlled using the fluid supply unit 120, thereby reducing a temperature difference between the center and edge of the window 100. In addition, since the plasma processing device 1 includes the plate 110 and the gas feed 140 including the same material, the magnetic field generated by the antenna 130 is allowed to be incident into the entire area of the window 100 with the same intensity through a coupling structure of the plate 110 and the gas feed 140.

Additionally, when necessary, the fluid supply unit 120 selectively supplies a first fluid (e.g., cool air) and a second fluid (e.g., hot air), thereby efficiently controlling the temperature of the window 100.

Consequently, the plasma processing device 1 may reduce a temperature difference between the center and edge of the window 100, thereby appropriately controlling thermal stress and a processing distribution in the window 100.

In addition, the temperature difference between the window for plasma-processing the first wafer and the window for plasma-processing the last wafer and the etching interval difference between the wafer plasma-processed for the first time and the wafer plasma-processed for the last time can be reduced by appropriately controlling the thermal stress and processing distribution in the window 100.

Hereinafter, a plasma processing device according to another embodiment of the present invention will be described with reference to FIG. 15. The difference from the plasma processing device of FIG. 1 will be described in detail.

Figure 15:
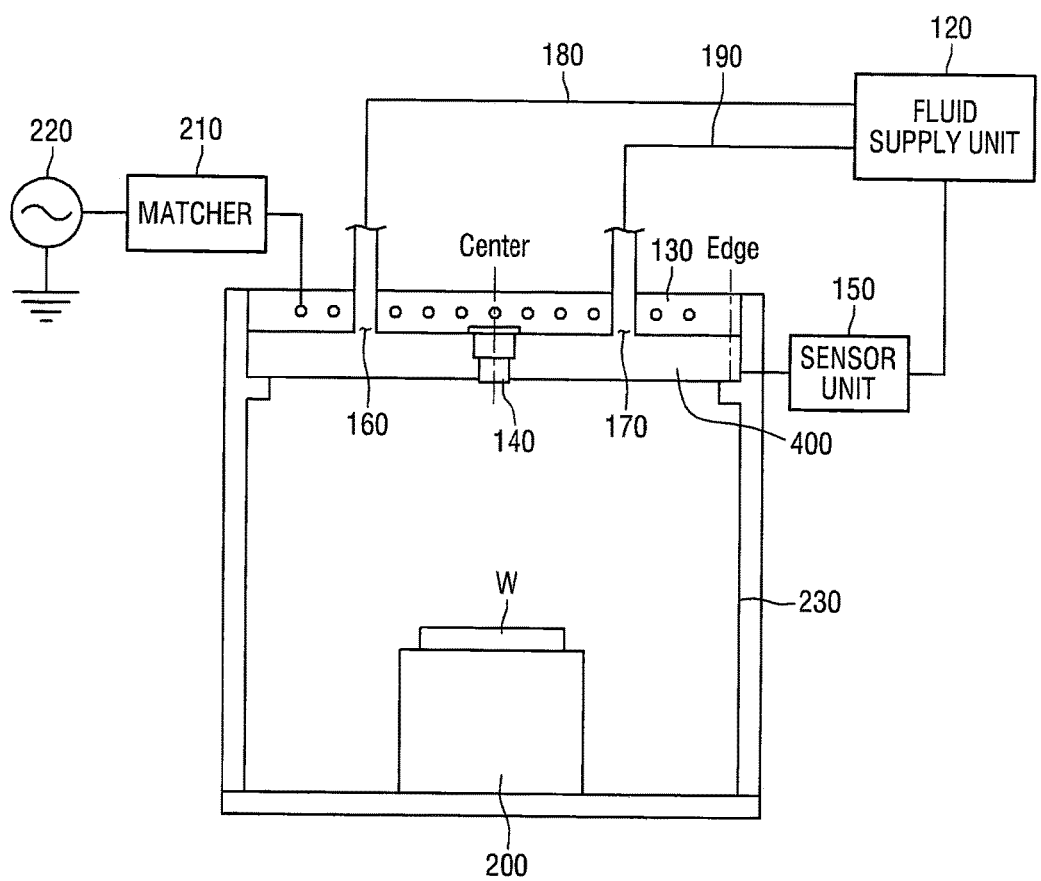
FIG. 15 is a schematic view illustrating a plasma processing device according to another embodiment of the present invention

Unlike the plasma processing device 1 of FIG. 1, the plasma processing device 2 of FIG. 15 may not comprise a plate 110 of FIG. 1.

Specifically, the plasma processing device 2 may comprise a window 400 having a function and an effect of plate 110 of FIG. 1. Here, a method for fabricating the window 400 is as below. First of all, the window 400 is divided into two parts; cooling pipes (not shown) are processed in any one part of two parts. After that, both of two parts are sintered to make one integrated part. That is, like the plate 110 of FIG. 1, window 400 may comprise cooling pipe (not shown) therein.

Further, the window 400 may include a dielectric material. The dielectric material may include, for example, $Al_2O_3$, but not limited thereto.

In summary, like the plate 110 of FIG. 1, since the window 400 of a plasma processing device 2 of FIG. 15 includes cooling pipes (not shown) therein, the overall temperature of the window 400 may be uniformly maintained. That is, the plasma processing device 2 of FIG. 15 doesn't include any plate such as the plate 110 of FIG. 1 separately (in other words, there is a structural difference between the plasma processing device 1 and the plasma processing device 2) but may have same effect with the plasma processing device 1 of FIG. 1.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A plasma processing device comprising:
   a plate between a window covering a top portion of a chamber where plasma processing is performed and an antenna generating a magnetic field, wherein the plate comprises a coupling groove that extends from an edge of the plate to a central portion of the plate and that exposes a top portion of the window, wherein the plate comprises first and second regions configured to receive a fluid, and wherein the edge of the plate contains a material having a thermal conductivity of less than 20 [W/m−k];
   a gas feed configured to supply a processing gas different from the fluid to an inside of the chamber, wherein the as feed extends from the edge of the plate to the central portion of the plate, and the gas feed is engaged with the coupling groove, and
   a fluid supply unit configured to supply the fluid to the first and second regions of the plate that controls a temperature of the window and the antenna, wherein the fluid supply unit is configured to independently control flow of the fluid in the first and second regions, and wherein a temperature of an edge of the window is controlled by the edge of the plate and a temperature of a center of the window is controlled by the fluid flowing through the first and second regions,
   wherein the gas feed and the plate include the same material.

2. The plasma processing device of claim 1, wherein the first region includes an inlet port through which the fluid flows in and an outlet port through which the fluid flows out.

3. The plasma processing device of claim 2, wherein the first region comprises a fluid conduit having one end connected to the inlet port, and an opposite end connected to the outlet port.

4. The plasma processing device of claim 2, further comprising:
   an inlet pipe connecting the inlet port and the fluid supply unit; and
   an outlet pipe connecting the outlet port and the fluid supply unit.

5. The plasma processing device of claim 1, further comprising a clamp connecting the plate and the window.

6. The plasma processing device of claim 1, wherein the fluid supply unit is configured to supply a first fluid that lowers temperatures of the window and the antenna and a second fluid that raises the temperature of the window.

7. The plasma processing device of claim 6, further comprising a temperature sensor unit configured to sense the temperature of the window, wherein the fluid supply unit receives the temperature of the window from the temperature sensor unit.

8. The plasma processing device of claim 7, wherein the fluid supply unit supplies one of the first and second fluids to the plate according to the temperature of the window.

9. The plasma processing device of claim 1, wherein the coupling groove crosses a portion of the plate between the first and second regions.

10. A plasma processing device comprising:
    a plate between a window covering a top portion of a chamber where plasma processing is performed and an antenna generating a magnetic field, wherein the plate comprises a coupling groove that extends from an edge of the plate to a central portion of the plate and that exposes a top portion of the window, wherein the edge of the plate contains a material having a thermal conductivity of less than 20 [W/m−k];
    a gas feed configured to supply a processing gas different from a first fluid and a second fluid to an inside of the chamber, wherein the gas feed extends from the edge of the plate to the central portion of the plate, and the gas feed is engaged with the coupling groove;
    a temperature sensor unit sensing a temperature of the window; and
    a fluid supply unit configured to supply the first fluid that lowers the temperature of the window and the antenna and the second fluid that raises the temperature of the window and configured to receive the temperature of the window from the temperature sensor unit,
    wherein the fluid supply unit supplies one of the first and second fluids to the plate according to the temperature of the window, and wherein a temperature of an edge of the window is controlled by the edge of the plate and a temperature of a center of the window is controlled by the fluid flowing through the plate, and
    wherein the gas feed and the plate include the same material.

11. The plasma processing device of claim 10, further comprising:
    a clamp connecting the plate and the window and mounted at a lower portion of an edge of the plate; and
    inlet and outlet pipes connecting the plate and the fluid supply unit.

12. The plasma processing device of claim 11, wherein the window includes a slide groove, the clamp includes a slide protrusion engaged with the slide groove, and one end of each of the inlet and outlet pipes is fixed to a top surface of the plate.

* * * * *